United States Patent [19]

Soto Viso et al.

[11] Patent Number: 6,025,750

[45] Date of Patent: Feb. 15, 2000

[54] DIGITAL FILTER WITH LONG IMPULSE RESPONSE

[75] Inventors: Jesús Soto Viso; Jose Luis Del Cerro Hiniesto, both of Madrid, Spain

[73] Assignee: Alcatel, Paris, France

[21] Appl. No.: 09/066,906

[22] Filed: Apr. 28, 1998

[30] Foreign Application Priority Data

Apr. 30, 1997 [ES] Spain ................................. P9700938

[51] Int. Cl.[7] ............................................. H03K 5/00
[52] U.S. Cl. ........................... 327/552; 327/231; 327/263; 327/248
[58] Field of Search ..................... 327/551, 552, 327/261, 263, 248, 231; 708/318; 375/232

[56] References Cited

U.S. PATENT DOCUMENTS 4,737,724  4/1988  Porrot ..................................... 327/553
5,781,462  7/1998  Yamanaka et al. ................. 364/724.16

*Primary Examiner*—Dinh T. Le
*Attorney, Agent, or Firm*—Sughrue, Mion, Zinn, Macpeak & Seas, PLLC

[57] ABSTRACT

A digital filter includes a)—a plurality of means for the sampling (10, 11, 12, 13, 20, 21, 22, 30, 31) with different delays, of an incoming signal (S), and b)—means (7) to carry out a linear combination of samples produced by the said sampling means (10, 11, 12, 13, 20, 21, 22, 30, 31). The filter is characterized in that a sampling frequency (F/2) of at least some of the sampling means (20, 21, 22) which are associated with delays longer than some of the other sampling means (10, 11, 12, 13) is lower than a sampling frequency (F) of said other sampling means.

4 Claims, 2 Drawing Sheets

DIGITAL FILTER WITH LONG IMPULSE RESPONSE

FIELD OF THE INVENTION

The present invention refers to a digital filter. According to an example of embodiment, the filter is used in a device for the cancellation of echo or inter-symbolic interference (ISI) in the transmission of two wire duplex data, and adaptive equalization through DFE (Decisior Feedback Equaliser) structures. More generally, the filter of the invention can be used in all applications requiring a digital filter.

STATE OF THE ART

Two types of digital filters already exist in the state of the art. These are the IIR (Infinite Impulse Response) filter and the FIR (Finite Impulse Response) filter. In some applications FIR filters need a very large number of coefficients, as a result of a very long impulse response to the signal that they are filtering. This very large number of coefficients renders the filter not viable, because a large storage capacity is required for coefficients and calculations.

SUMMARY OF THE INVENTION

One objective of the present invention is to propose a digital filter of the FIR type, presenting the advantage of a reduced number of coefficients. Therefore, a digital filter including a)—a plurality of means for the sampling, with different delays, of an incoming signal, and b)—means to carry out a linear combination of samples produced by the said sampling means, is characterized, according to the invention, in that a sampling frequency of at least some of the sampling means which are associated with delays longer than some of the other sampling means, is less than a sampling frequency of said other sampling means.

Typically, in the digital filter of the invention, the sampling means define at least two sets of sampling means in cascade, each set being defined, respectively, by a sampling frequency.

The output signal of the filter, according to the invention, must be as near as possible to one which is obtained from a conventional FIR filter which includes a large number of coefficients. Therefore, the first sampling means in each of the sets, except the first set, receives an input signal defined by the sum of the N signals respectively produced by the last N sampling means in the preceding set, N being the quotient between the sampling frequency of the preceding set and the sampling frequency of the set under consideration. Therefore, each linear coefficient combination associated with a sampling mean in each of the sets, except the first set, is defined by a measure of N coefficients of a conventional FIR filter.

BRIEF DESCRIPTION OF THE DRAWINGS

A more detailed explanation of the present invention is given in the description below, based on the attached drawings in which.

DESCRIPTION OF THE INVENTION

Figure 2:
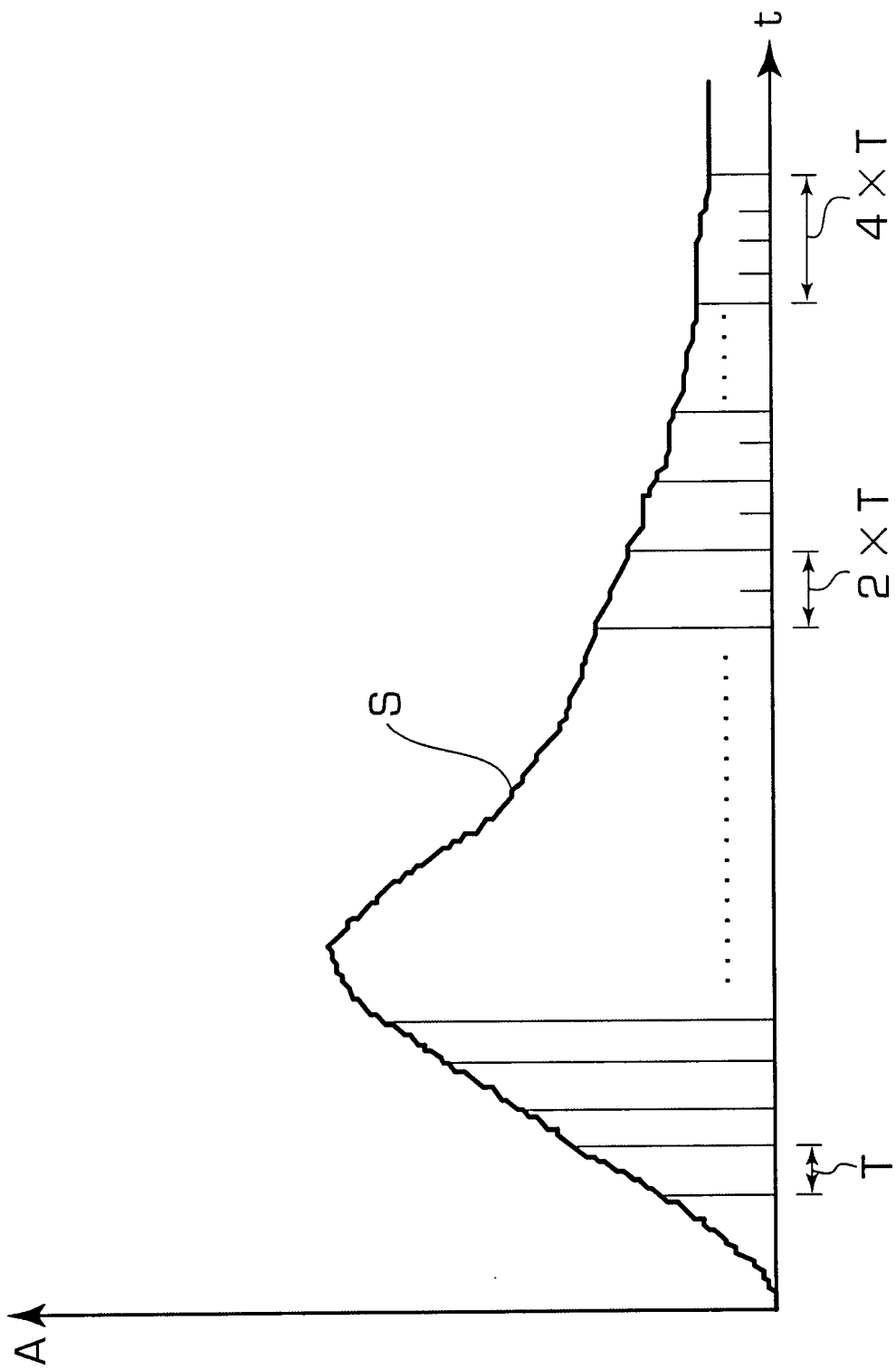
FIG. 2 shows a representation of an impulse response signal in order to explain the invention.

FIG. 2 shows an impulse response signal (S), the amplitude of which (A) varies over time (t). At the final part of the impulse response signal (S) the variation is significantly reduced, that is, the signal (S) has an almost null derivation with regard to the time (t). This means that with a defined delay which depends on the channel, the contribution of one symbol is very similar to that of the adjacent symbols, in such a way that, according to the invention, a same digital filter coefficient can be applied to at least two successive symbols. In a particular case of the embodiment of the invention in an equalizer, the symbol contributes to the inter-symbolic interference, or echo, and the coefficient serves to cancel the delayed negative effects of a symbol.

Figure 1:
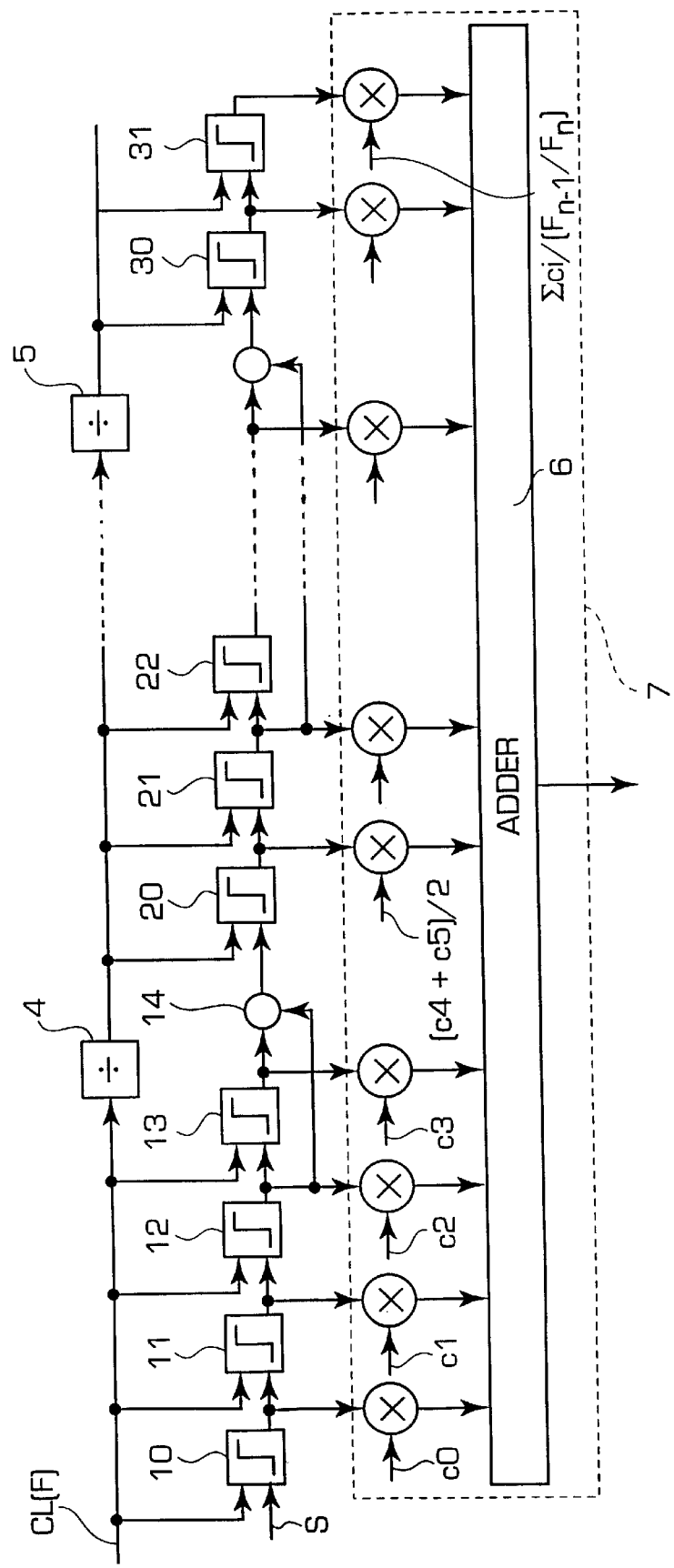
FIG. 1 shows a block diagram of a digital filter according to the invention.

FIG. 1 shows an example of the embodiment of a digital filter, according to the invention, including:

sampling circuits (10, 11, 12, 13, 20, 21, 22, 30 and 31) connected in cascade, a linear combination unit (7), comprising multipliers and an adder (6), and frequency dividers (4 and 5).

In the representation in FIG. 1, the sampling circuits are of the D flip-flop type, connected in cascade. Each flip-flop receives a sampling signal at its clock input and the signal that it samples at the data input. The data output of a flip-flop is applied to the data input of the next flip-flop. A flip-flop samples an input signal (S) with a delay which corresponds to its range in the filter.

The sampling circuits can define at least two sets of sampling circuits {10, 11, 12, 13}, {20, 21, 22} and {30, 31} connected in cascade. The sampling circuits in the first set {10, 11, 12, 13} sample the signal received with a frequency (F), defined by a reference clock signal (CL). The sampling circuits in the second set {20, 21, 22} sample the signal received (S), with a frequency of (F/2), defined by a clock signal (CL), when it is received through the frequency divider (4). Finally, the sampling circuits in the third set {30, 31} sample the signal received (S), with a frequency of (F/4), defined by a clock signal (CL), when it is received through the frequency dividers (4 and 5). Thus each set of sampling circuits is defined by a sampling frequency respectively, which results in the following: the amplitude of the end of the impulse response signal (S), is defined by a variation in relation to time which becomes shorter and shorter. In this way, the number of coefficients and the calculation capacity may be reduced if a sampling frequency (F/2) of at least some of the sampling circuits {20, 21, 22}, associated with longer delays than some of the other sampling means {10, 11, 12, 13}, is less than the sampling frequency (F), of said other sampling means.

Each filter multiplier multiplies the output signal of a flip-flop by a respective coefficient, c1, c2, c3, . . . The resulting signals are added in the adder (7), to produce the filtered output signal.

As a consequence of the presentation mentioned below, it follows that if no solution is applied, then a part of the information is lost due to the reduction of the sampling frequency. For example: during a fixed time interval, two samples are released by flip flop (13), and during the same time the next flip-flop (20), samples the received signal only once. Therefore a part of the information is lost in the filter. To resolve this problem, the present invention proposes that flip flop (20), receives an input signal which is defined by the sum of the two signals respectively produced by the last N=2 sampling circuits (12 and 13), N=2 being the quotient between the sampling frequency (F), and the sampling frequency (F/2). An adder (14), is used to add these two signals. In order to generalize this solution, it can be said that the first sampling circuit of each of the sets, except the first set, receives an input signal defined by the sum of the N signals respectively produced by the last N sampling circuits of the preceding set, N being the quotient between the sampling frequency of the preceding set and the sampling frequency of the set under consideration.

Consequently, each linear combination coefficient associated with a sampling circuit in each of the sets, except the first set, is defined by a measure of N coefficients $\Sigma\{ci/(F_{n-1}/F_n\}$ of a conventional FIR filter, $F_{n-1}$ and $F_n$ being the respective frequencies of the preceding set and the set under consideration. Thus, a filter is obtained which produces a filtered signal as near as possible to a conventional FIR filter.

The present invention can be implemented, at least partly, in a computer program.

We claim:

1. A digital filter including:
   a) a plurality of sampling means (10, 11, 12, 13, 20, 21, 22, 30, 31) for sampling respectively, with different delays, an input signal (S); and
   b) means (7) for carrying out a linear combination of samples produced by the said sampling means (10,11, 12, 13, 20,21,22,30,31) to generate a combine signal, wherein a sampling frequency (F/2) of a second set of the sampling means (20, 21, 22), which are associated with longer delays than a first set of sampling means (10, 11, 12, 13), is lower than a sampling frequency (F) of said first set of sampling means.

2. A digital filter according to claim 1, wherein at least said first set of sampling means said second set of sampling means are in cascade.

3. A digital filter according to claim 2, wherein a first sampling means in each one of the cascaded sets, except the first set, receives an intermediate input signal that is the sum of N signals respectively produced by a last N sampling means of a preceding set, N being a quotient of the sampling frequency of the preceding set and the sampling frequency of the set under consideration.

4. A digital filter according to claim 2, wherein said each sampling means has a respective output signal, each output signal of said sampling means being multiplied by a coefficient, and wherein said multiplied output signals are summed in said means for carrying out a linear combination of samples, said means comprising an adder (6) for generating said combined signal as a filtered output signal.

* * * * *